US007237648B2

(12) United States Patent
Lee et al.

(10) Patent No.: US 7,237,648 B2
(45) **Date of Patent: *Jul. 3, 2007**

(54) SURROUND SOUND POSITIONING TOWER SYSTEM AND METHOD

(75) Inventors: Noel Lee, Las Vegas, NV (US); Demian Martin, San Leandro, CA (US)

(73) Assignee: Monster Cable Products, Inc., Brisbane, CA (US)

( * ) Notice: Subject to any disclaimer, the term of this patent is extended or adjusted under 35 U.S.C. 154(b) by 283 days.

This patent is subject to a terminal disclaimer.

(21) Appl. No.: 10/753,760

(22) Filed: Jan. 7, 2004

(65) Prior Publication Data

US 2005/0058314 A1 Mar. 17, 2005

Related U.S. Application Data

(63) Continuation-in-part of application No. 10/655,095, filed on Sep. 3, 2003.

(51) Int. Cl.
*A47B 81/06* (2006.01)
*H05K 5/02* (2006.01)
*H04R 5/02* (2006.01)
*H04R 1/02* (2006.01)

(52) U.S. Cl. ...................... 181/199; 181/148; 381/300; 381/387

(58) Field of Classification Search ................ 181/199, 181/148; 381/300, 387, 303–305
See application file for complete search history.

(56) References Cited

U.S. PATENT DOCUMENTS 3,754,618 A * 8/1973 Sasaki ........................ 181/145
4,054,750 A * 10/1977 Montgomery et al. ...... 381/335
4,139,734 A * 2/1979 Fincham ..................... 381/335
4,267,405 A * 5/1981 Russell ....................... 381/305
4,292,679 A * 9/1981 Kondo et al. ............... 367/188
4,365,114 A * 12/1982 Soma ......................... 381/182

(Continued)

FOREIGN PATENT DOCUMENTS

DE 3916496 A1 * 11/1990

(Continued)

OTHER PUBLICATIONS

Enjoy the music. com "Precisoin Alignment Made Simple"; http://www.enjoythemusic.com/magazine/equipment/1299/sas.htm.*

(Continued)

*Primary Examiner*—Edgardo San Martin
(74) *Attorney, Agent, or Firm*—LaRiviere, Grubman & Payne, LLP

(57) ABSTRACT

A surround sound system and method involving a surround sound tower (10) having planar speakers (11*b*); a base plate (20); and a structure for positioning (30) the surround sound tower on the base plate (20), the surround sound tower (10) being mounted on, and normal to, the positioning structure (30) for customizing sound direction and constructive interference patterns by interactively positioning the sound tower (10) and by modular usage of both sub-woofers (12*a*) and tweeters (13*a*), economizing floor space, especially in a home theater environment, the positioning structure (30) having a structure for indicating an angular rotation (40) of the surround sound tower (10) relative to the base plate (20) and a structure for facilitating rotation (50) of the angular rotation indicating structure (40).

18 Claims, 9 Drawing Sheets

U.S. PATENT DOCUMENTS

| | | | | |
|---|---|---|---|---|
| 4,441,577 | A * | 4/1984 | Kurihara | 181/147 |
| 4,450,322 | A * | 5/1984 | Wilson | 381/59 |
| 4,553,630 | A * | 11/1985 | Ando | 181/144 |
| 4,696,037 | A * | 9/1987 | Fierens | 381/300 |
| 4,757,544 | A * | 7/1988 | Guy | 381/387 |
| 4,811,406 | A * | 3/1989 | Kawachi | 381/186 |
| 4,884,655 | A * | 12/1989 | Freadman et al. | 181/145 |
| 4,953,223 | A * | 8/1990 | Householder | 381/387 |
| 5,440,645 | A * | 8/1995 | Freadman | 381/386 |
| 5,802,190 | A * | 9/1998 | Ferren | 381/182 |
| 6,603,859 | B1 * | 8/2003 | Asano | 381/59 |
| 6,628,793 | B1 * | 9/2003 | Porzilli et al. | 381/182 |
| 6,643,379 | B1 * | 11/2003 | Onglao | 381/351 |
| 6,792,117 | B2 * | 9/2004 | Liu | 381/87 |
| D512,986 | S * | 12/2005 | Lee et al. | D14/211 |
| 7,090,047 | B1 * | 8/2006 | Lee et al. | 181/199 |
| 2003/0031330 | A1 * | 2/2003 | Kim | 381/111 |
| 2004/0222038 | A1 * | 11/2004 | Nakamura | 181/199 |

FOREIGN PATENT DOCUMENTS

| | | | |
|---|---|---|---|
| DE | 4219689 | A1 * | 12/1993 |
| JP | 60167594 | A * | 8/1985 |
| JP | 60186192 | A * | 9/1985 |
| JP | 61020489 | A * | 1/1986 |
| JP | 62018898 | A * | 1/1987 |
| JP | 62269597 | A * | 11/1987 |
| JP | 63036698 | A * | 2/1988 |
| JP | 04175096 | A * | 6/1992 |
| JP | 04351196 | A * | 12/1992 |

OTHER PUBLICATIONS

Product Review, Checkpoint Tools, Sound Alignment-System, webpage http://www.laaudiofile.com/sas.html, May 2002.

* cited by examiner

SURROUND SOUND POSITIONING TOWER SYSTEM AND METHOD

CROSS-REFERENCE TO RELATED APPLICATION(S)

The present continuation-in-part application is related to, and claims priority from, U.S. Ser. No. 10/655,095, entitled "Surround Sound Positioning Tower System and Method" and filed Sep. 3, 2003.

TECHNICAL FIELD

The present invention relates to surround sound systems and methods. More particularly, the present invention relates to surround sound tower systems and methods. Even more particularly, the present invention relates to surround sound positioning tower systems and methods.

BACKGROUND ART

Installing a home theater system which recreates the acoustic experience of any given soundtrack is vital to meeting the electronic consumer's expectations. Current art home theater surround sound systems typically involve compact disc/digital video disc (CD/DVD) players or changers, audio/visual (A/V) receivers, tuners, equalizers, headphones, satellite speakers, center channel speakers, woofers or subwoofers disposed in a fixedly mounted rectanguloid housing. Other current art home theater systems involve highly specialized installation/orientation features which require extensive technical training and are, thus, not well-suited for use by the average electronics consumer. One such current art home theater system involves a laser-based alignment tool being magnetically attached to a base plate; stacker discs for incrementally varying the height of the base plate; a speaker baffle; a beam splitter; a line lens; and a protractor plate. These complex components require some training and are used for optimizing speaker installation for a given set of room dimensions and conditions. The current art laser-based alignment tool does not allow for flexibility of room geometry nor for facilitating human factors in its use. Therefore, a need is seen to exist for a surround sound positioning tower system and method having a positioning feature for customizing sound direction and constructive interference patterns by the average electronics consumer, especially in a home theater.

DISCLOSURE OF THE INVENTION

The present invention surround sound system and method addresses the current need for a surround sound positioning tower system and method having a positioning feature for customizing sound direction and constructive interference patterns by the average electronics consumer, especially in a home theater. The present invention system facilitates consistent geometric alignment of a multi-channel sound system and is integrated into any type of speaker system. The present invention surround sound system has a surround sound tower being vertically disposed, a base plate being horizontally disposed, and a structure for positioning the surround sound tower on the base plate. The surround sound tower is mounted on, and normal to, the positioning structure. The positioning structure has a structure for indicating an angular rotation of the surround sound tower relative to the base plate and a structure for facilitating rotation of the angular rotation indicating structure. The angular rotation indicating structure has a pointer plate with a visible marking, e.g., a calibrating dial. The facilitating structure has a plurality of ball bearings. The base plate has a plurality of angular indications, e.g., reference center points and calibrated angular indications, such as small lines every 5 degrees and large lines every 10 degrees with a range of at least 180 degrees, for precisely orienting or positioning the tower. The surround sound tower has at least one feature. The sub-woofer module has a sub-woofer and a detachable permeable sub-woofer housing disposed around the sub-woofer. The tweeter module has a tweeter and a detachable permeable tweeter housing disposed around the tweeter. The detachable permeable sub-woofer housing has a nested configuration and is pegged to base plate. The present invention system also has a binding post disposed at a rear surface of the tower for electronically coupling the tower to the positioning structure and a structure for indicating a sonic intensity. The sonic intensity indicating structure is a light pipe. Such light pipe is disposed on a rear side of the tower for producing an aura visual effect when frontally viewed.

At least one surround sound system is simply configured in a home theater environment for customizing sound direction and constructive interference patterns by the average electronics consumer, because each system has its own positioning structure, whereby repeatability is provided for any given prior positioning selection in the event that the at least one system becomes disoriented, e.g., by a seismic event. The present invention system further has simulation software for generating precise geometric data; and electromechanical actuators, receiving the generated data, for facilitating customizing and optimizing sound direction and constructive interference patterns by the average electronics consumer, given the room dimensions and furniture configuration.

The present invention surround sound method involves the steps of providing a surround sound tower being vertically disposed, providing a base plate being horizontally disposed, and providing structure for positioning the surround sound tower on the base plate. The surround sound tower is mounted on, and normal to, the positioning structure, as discussed, supra. Further details with respect to the present method are discussed, infra.

The present invention method further involves disposing the at least one system in a room by using a tape measure, a string, a rope, or any other tension structure for defining a reference line between any given two systems, aligning the at least one positioning structure of the at least one system to the reference line, thereby precisely disposing the at least one system at a uniform distance from a listening position, and thereby providing repeatability for any given prior positioning selection in the event that the at least one system becomes disoriented, e.g., by a seismic event. The present invention method further involves providing simulation software for generating precise geometric da and providing electromechanical actuators, receiving the generated data, for facilitating customizing and possibly optimizing sound direction and constructive interference patterns by the average electronics consumer, given the room dimensions and furniture configuration.

Advantages include simplifying the customization and optimization of sound direction and constructive interference patterns by interactively positioning the sound tower or at least one sound tower and by modular usage of speakers, economizing floor space by vertically disposing the tower(s) on any horizontal surface, such as a shelf, a platform as well as a floor, especially in a home theater environment by the average electronics consumer. Other features of the present invention are disclosed, or are apparent in the section entitled "Detailed Description of the Invention," disclosed, infra.

BRIEF DESCRIPTION OF THE DRAWING(S)

For a better understanding of the present invention, reference is made to the below referenced accompanying Drawing(s). Reference numbers refer to the same or equivalent parts of the present invention throughout the several figures of the Drawing(s).

MODES FOR CARRYING OUT THE INVENTION

Figure 1:
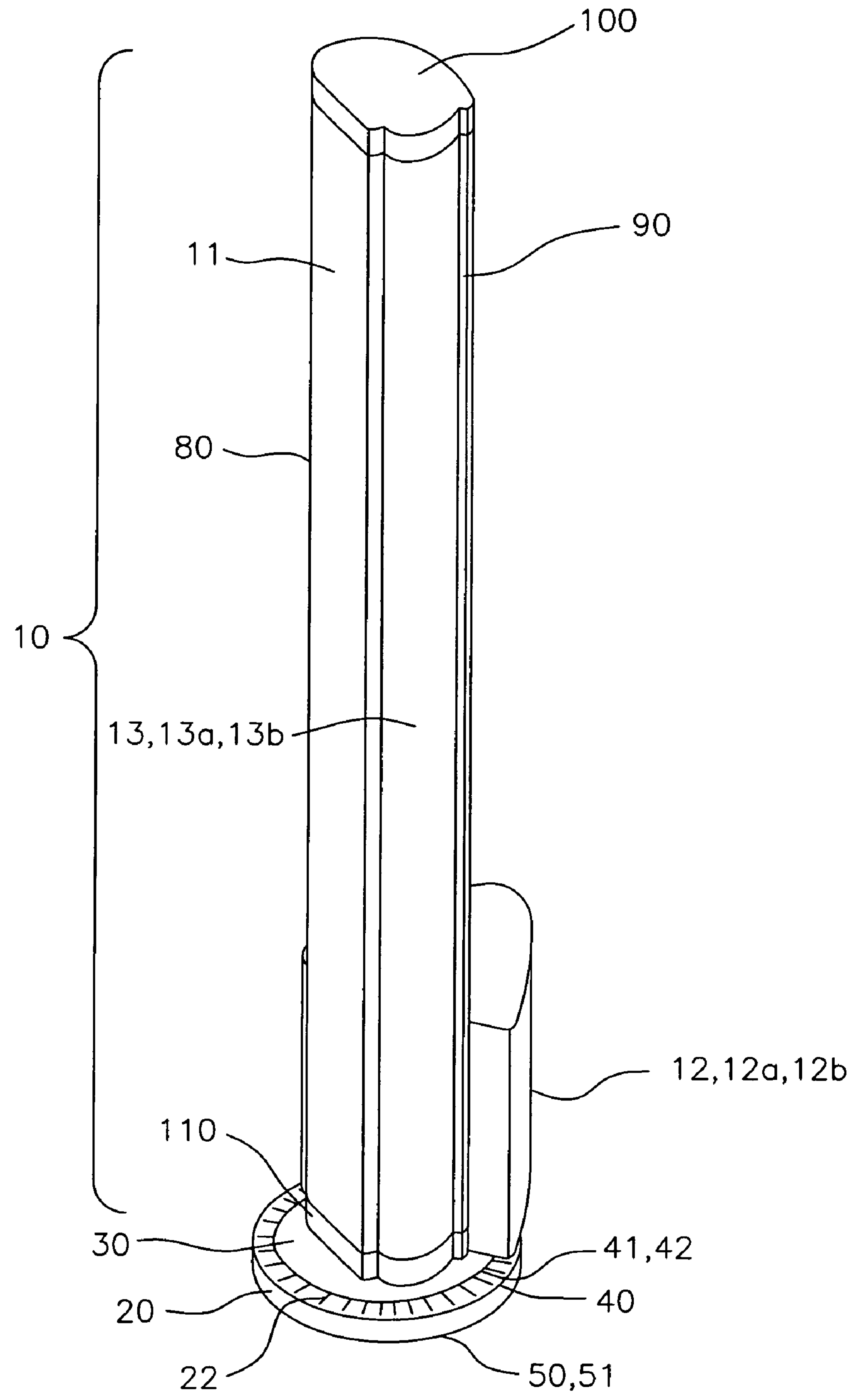
FIG. 1 is a perspective view of a surround sound system, in accordance with the present invention.
Figure 2:
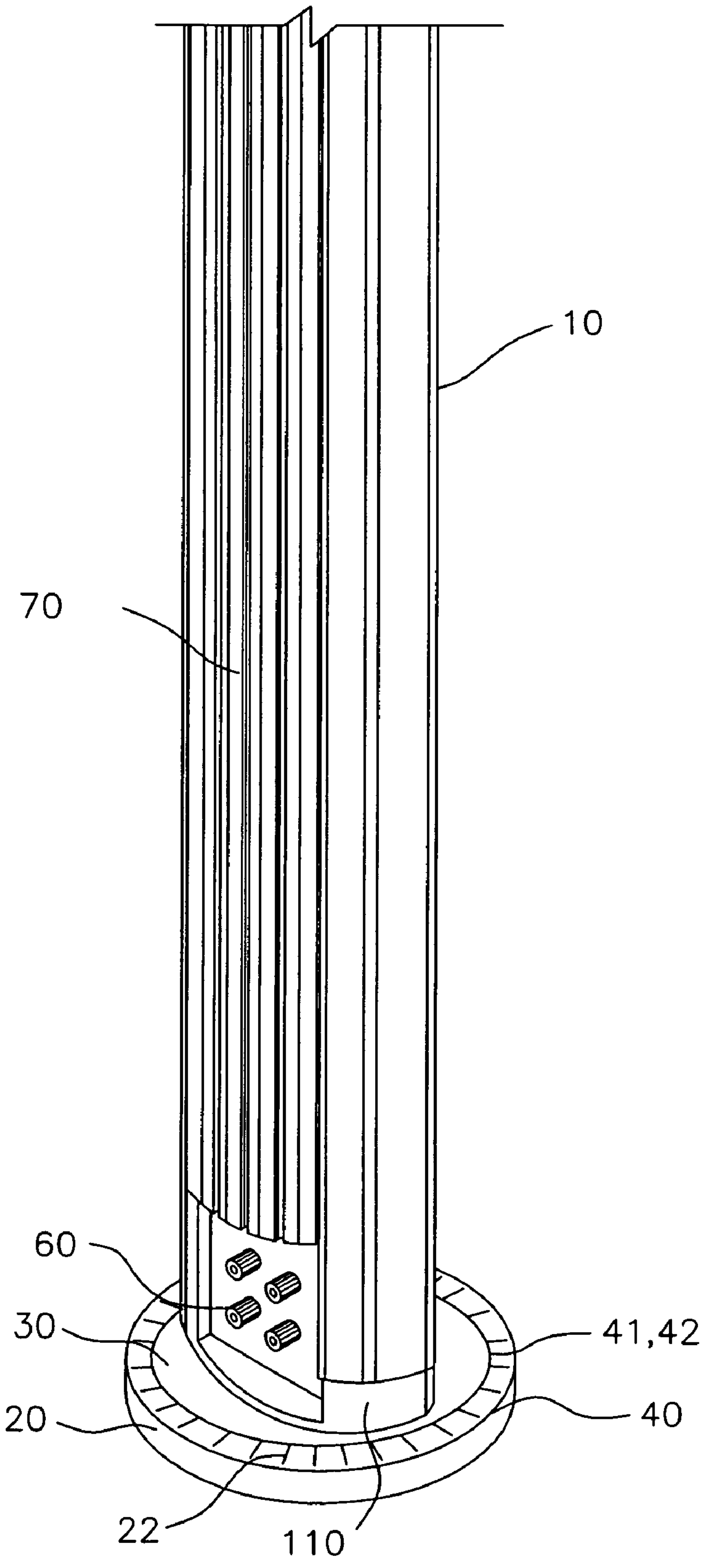
FIG. 2 is a cut-away rear perspective view of a surround sound system, in accordance with the present invention.

FIG. 1 illustrates, in a perspective view, a surround sound system has a surround sound tower 10 being horizontally disposed and having at least one planar speaker 11*b*, a base plate 20 being vertically disposed, and a structure for angular positioning 30 of the surround sound tower 10 on the base plate 20. The surround sound tower 10 is mounted on, and normal to, the angular positioning structure 30. The angular positioning structure 30 has a structure for indicating an angular rotation or position 40 of the surround sound tower 10 relative to the base plate 20 and a structure for facilitating rotation 50 of the angular rotation or position indicating structure 40. The angular rotation or position indicating structure 40 has a pointer plate 41 with a visible marking 42, e.g., a calibrating dial. The facilitating structure 50 has a plurality of ball bearings 51. The base plate 20 has a plurality of angular indications 22, e.g., reference center points and calibrated angular indications for precisely orienting or positioning the tower. The surround sound tower 10 also has at least one speaker 11 feature such as a center channel speaker 11*a*, a sub-woofer module 12, and a tweeter module 13. The sub-woofer module 12 has a sub-woofer 12*a* and a detachable permeable sub-woofer housing 12*b* disposed around the sub-woofer 12*a*. The tweeter module 13 has a tweeter 13*a* and a detachable permeable tweeter housing 13*b* disposed around the tweeter 13*a*. The detachable permeable sub-woofer housing 12*b* has a nested configuration and is pegged to the base plate. The present system also has a binding post 60 (not shown in FIG. 1, but shown in FIG. 2) disposed at a rear surface of the tower 10 for electronically coupling the tower 10 to the angular positioning structure 30 as well as a light pipe 70 (FIG. 2). The light pipe 70 is disposed on a rear side of the tower 10 for producing an aura visual effect when frontally viewed (FIG. 2). The light pipe 70 comprises at least one function such as indicating a sonic intensity and providing illumination (FIG. 2).

The surround sound tower 10 also has a grill cloth 80 disposed over the center channel speaker 11*a* or the planar speaker 11*b*, a side trim 90 disposed on the tower 10, a top cap 100 disposed at a top end of the tower 10, and a bottom cap 110 disposed on the pointer plate 41 as shown in FIG. 1. The sub-woofer module 12, the tweeter module 13, the grill cloth 80, the side trim 90 are each detachable. Each of the foregoing elements in the present invention is formed from at least one material such as a polymer, a wood, a metal, an anodized metal, an alloy, and a composite material. Preferably, the base plate 20 is formed from a material sufficiently heavy, such as a heavy polymer, a heavy wood (e.g., oak, mahogany, maple), a heavy yet non-toxic metal (e.g., cast or forged iron, cast or forged aluminum), a heavy yet non-toxic anodized metal (e.g., aluminum), a heavy yet non-toxic alloy (e.g., steel, cast steel, forged steel), and a heavy composite material, to support the surround sound tower 10. The light pipe 70 is formed from at least one material such as Plexiglass®, Lexan®, optic fibers, a fluorescent light source, an incandescent light source, and a phosphorescent light source. The plurality of ball bearings 51 also have a lubricant. The visible marking 42 have a colored line and possibly a calibrating dial on the pointer plate 41 being collinear with the user-adjusted angular position indicated on the base plate 20 or a tapered slot disposed in the pointer plate 41 being locked by, and unlocked from, a detent disposed on the base plate 20.

FIG. 2 illustrates, in a cut-away rear perspective view, a system having a binding post 60 (not shown in FIG. 1) disposed at a rear surface of the tower 10 for electronically coupling the tower 10 to an angular positioning structure 30, a light pipe 70, and the base plate 20 and attendant components (as in FIG. 1), in accordance with the present invention.

Figure 3:
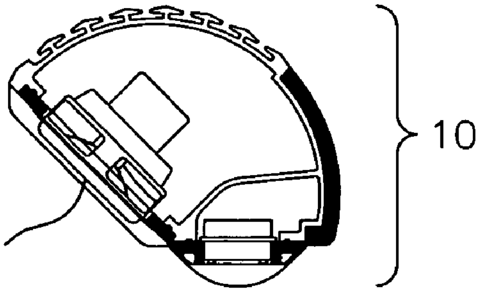
FIG. 3 is a cross-sectional view of a tower, in accordance with the present invention.

FIG. 3 illustrates, in a cross-sectional view, a system having a tower 10, and shows the angled disposition of a tower 10 having at least one feature such as a center channel speaker 11*a* and a planar speaker 11*b*, in accordance with the present invention.

Figure 4:
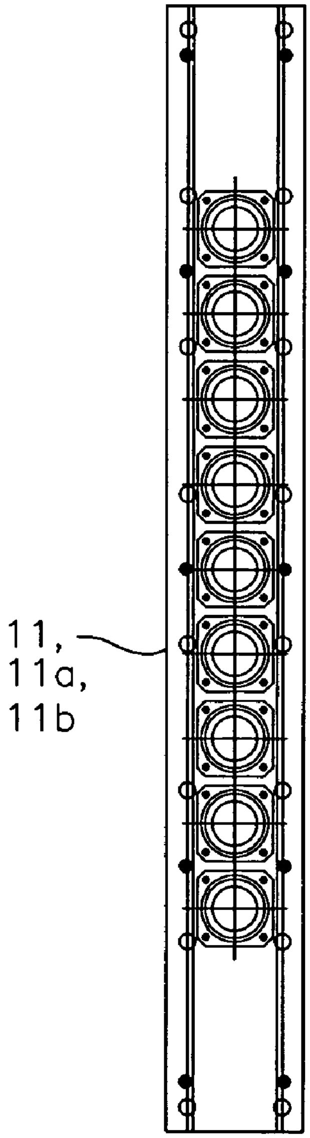
FIG. 4 is a front elevation view of a speaker, in accordance with the present invention.

FIG. 4 illustrates, in a front elevation view, a tower 10 having a feature such as a center channel speaker 11*a* or a planar speaker 11*b*, in accordance with the present invention.

Figure 5:
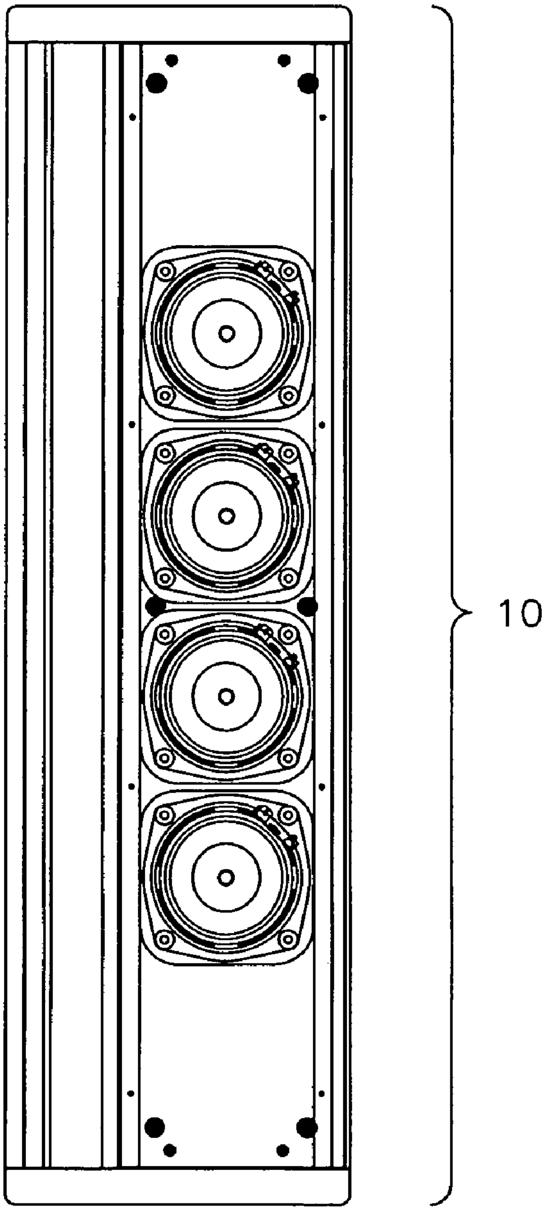
FIG. 5 is a front elevation view of a tower, in accordance with the present invention.

FIG. 5 illustrates, in a front elevation view, a tower 10, in accordance with the present invention.

Figure 6:
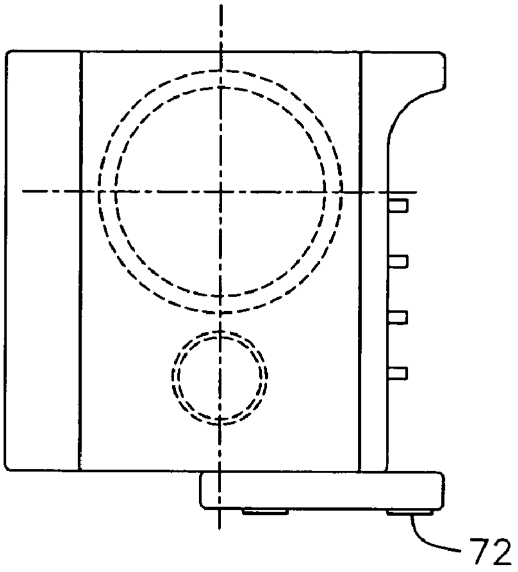
FIG. 6 is a side view of a tower, at cross-sections A—A and B—B, in accordance with the present invention.

FIG. 6 illustrates, in a side view, a tower 10, showing cross-sections A—A and B—B as well as at least one glide structure 72, in accordance with the present invention. The glide structure 72 comprises a smooth material such as Teflon® or any fluorinated polymer.

Figure 7:
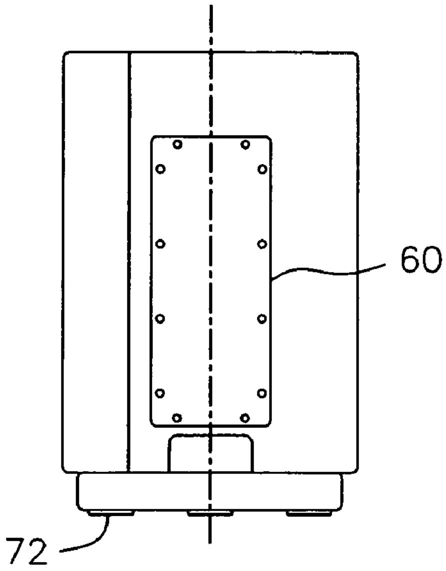
FIG. 7 is a rear view of a tower, in accordance with the present invention.

FIG. 7 illustrates, in a rear view, a tower 10, showing at least one glide structure 72 and a binding post 60, in accordance with the present invention.

Figure 8:
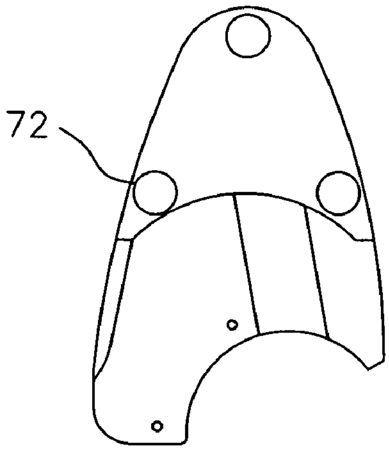
FIG. 8 is a bottom view of a tower, in accordance with the present invention.

FIG. 8 illustrates, in a bottom view, a tower 10, showing at least one glide structure 72, in accordance with the present invention.

Figure 9:
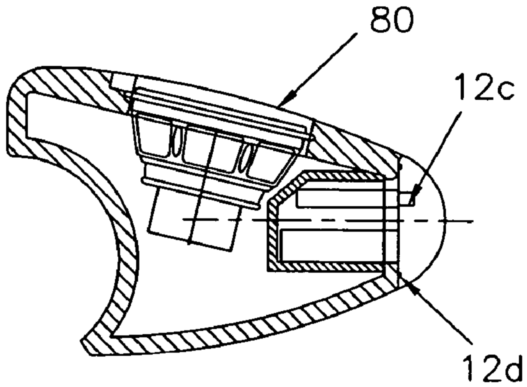
FIG. 9 is a cross-sectional view of a tower, at cross-section A—A, in accordance with the present invention.

FIG. 9 illustrates, in a cross-sectional view, a tower 10, taken at cross-section A—A, comprising: a grill cloth 80, an amplifier 12*c*, and fastener 12*d*, in accordance with the present invention.

Figure 10:
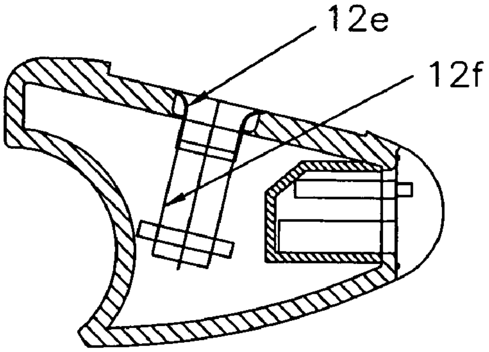
FIG. 10 is a cross-sectional view of a tower, at cross-section B—B, in accordance with the present invention.

FIG. 10 illustrates, in a cross-sectional view, a tower 10, taken at cross-section B—B, comprising a port tube 12*e* and a port tube adapter 12*f*, in accordance with the present invention.

Figure 11:
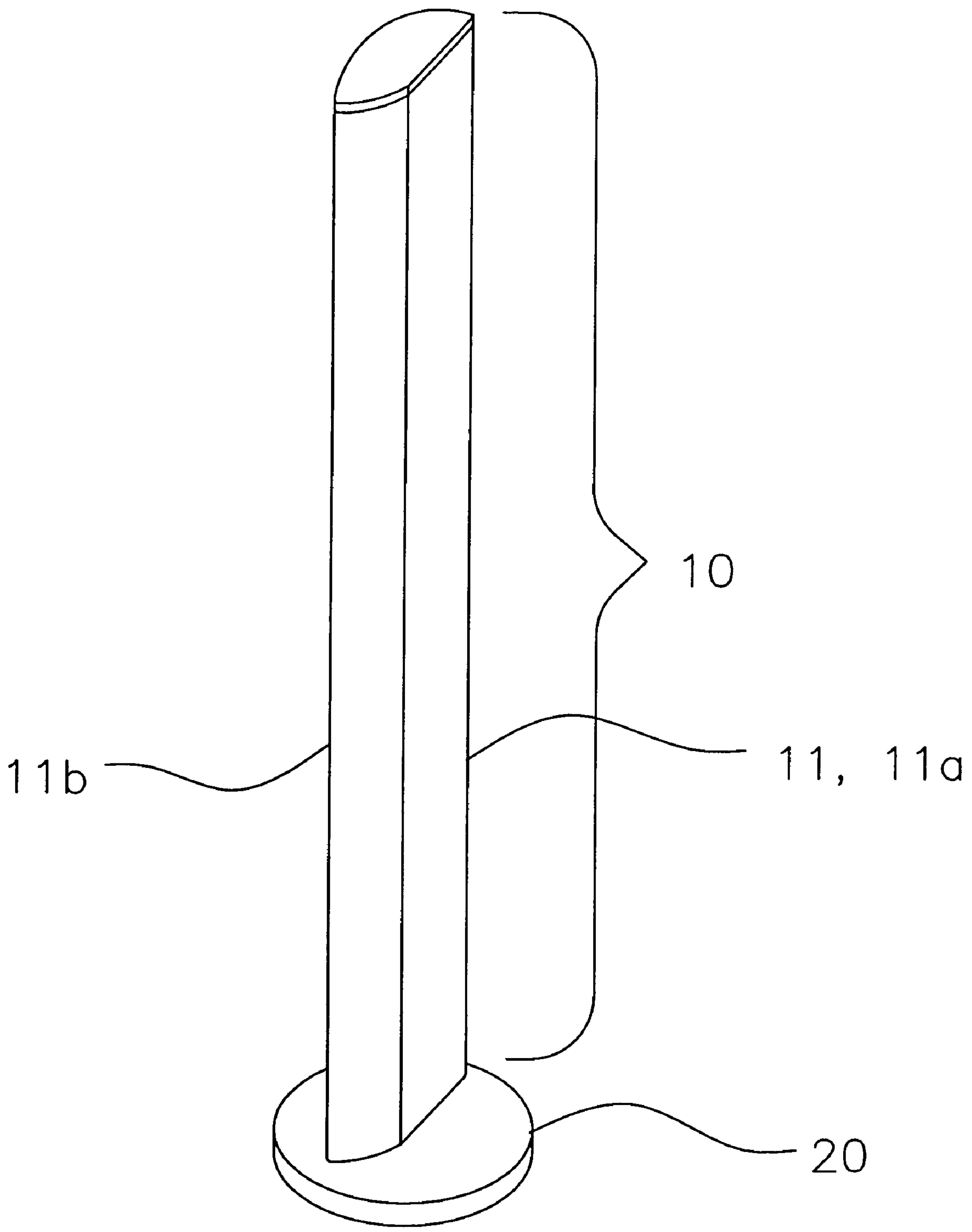
FIG. 11 is a front perspective view of a surround sound system, having planar speakers, in accordance with a preferred embodiment of the present invention.

FIG. 11 illustrates, in a front perspective view, a surround sound system, having a tower 10 with at least one speaker 11 feature such as a center-channel speaker 11*a* and a planar speaker 11*b*, the tower 10 being mounted on the base plate 20, in accordance with a preferred embodiment of the present invention.

Figure 12:
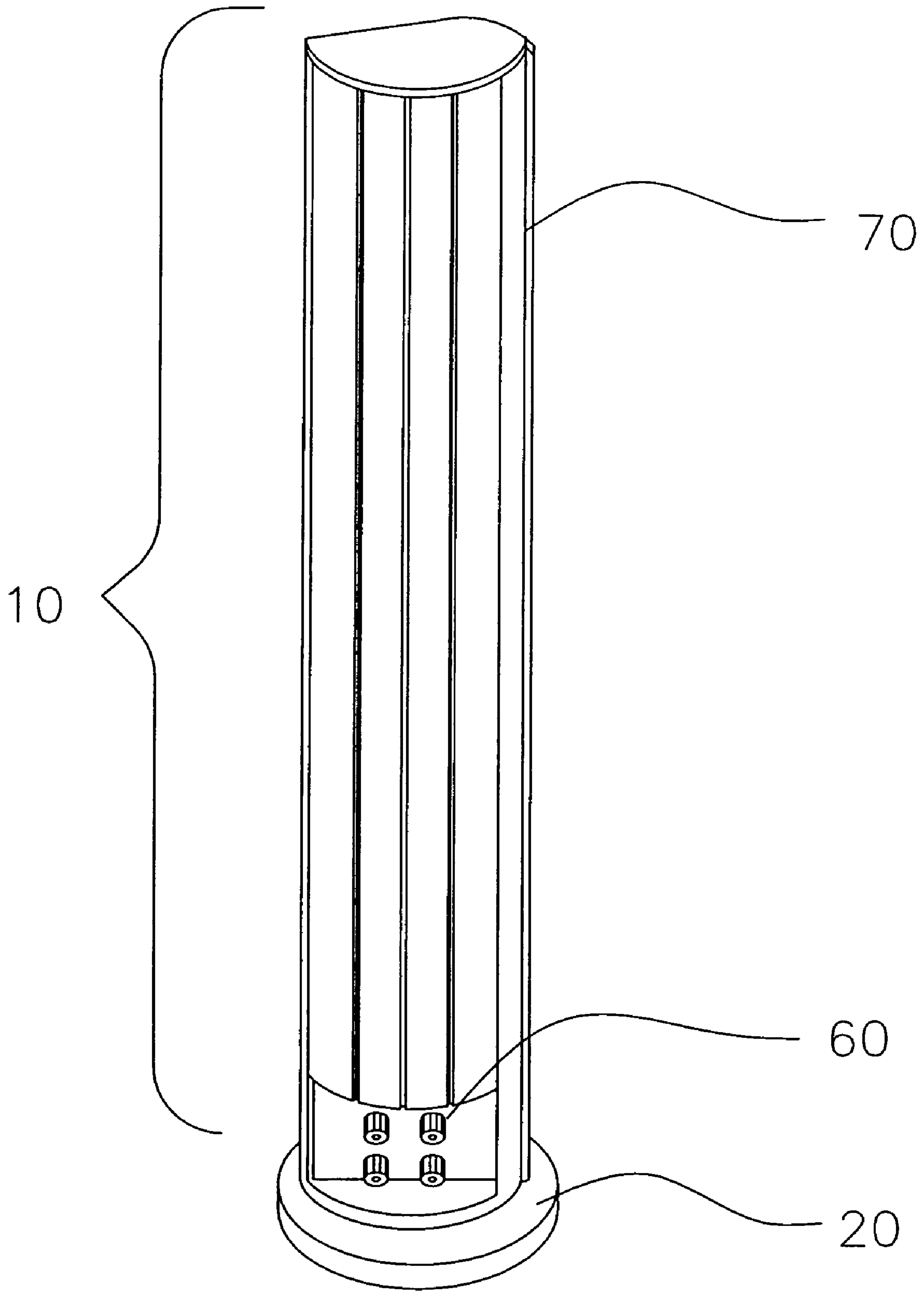
FIG. 12 is a rear perspective view of a surround sound system, having planar speakers, in accordance with a preferred embodiment of the present invention.

FIG. 12 illustrates, in a rear perspective view, a surround sound system, having a tower 10 with at least one speaker 11 feature such as a center-channel speaker 11*a* and a planar speaker 11*b*, and a light pipe 70, the tower 10 being mounted on the base plate 20, in accordance with a preferred embodiment of the present invention.

Figure 13:
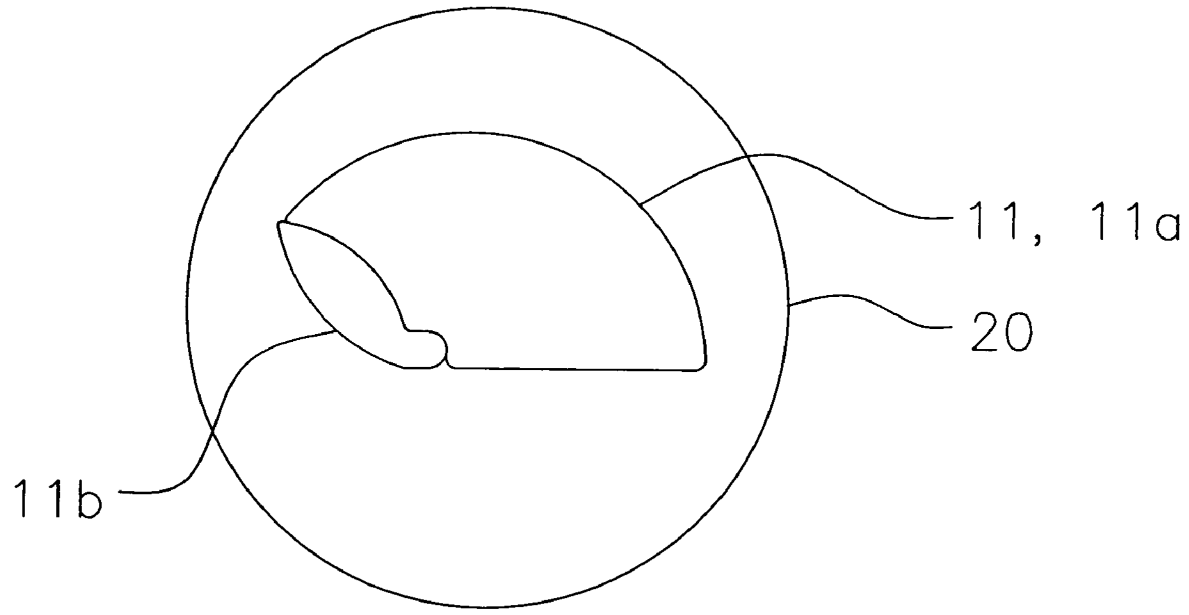
FIG. 13 is a cross-sectional view of a surround sound system, having planar speakers in a closed position, in accordance with a preferred embodiment of the present invention.

FIG. 13 illustrates, in a cross-sectional view, a surround sound system, having a tower 10 with at least one speaker 11 feature such as a center-channel speaker 11*a* and a planar speaker 11*b*, the tower 10 being mounted on the base plate 20, the planar speaker 11*b* being in the closed position, in accordance with a preferred embodiment of the present invention.

Figure 14:
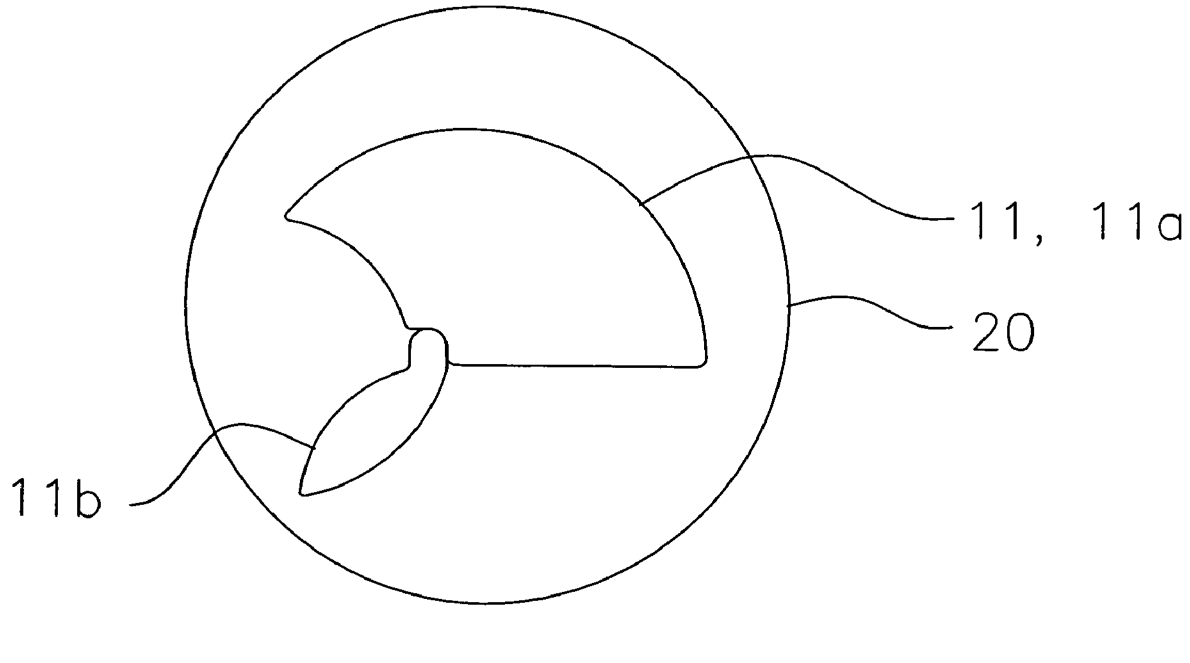
FIG. 14 is a cross-sectional view of a surround sound system, having planar speakers in an open position, in accordance with a preferred embodiment of the present invention.

FIG. 14 illustrates, in a cross-sectional view, a surround sound system, having a tower 10 with at least one speaker 11 feature such as a center-channel speaker 11*a* and a planar speaker 11*b*, the tower 10 being mounted on the base plate 20, the planar speaker 11*b* being in the open position, in accordance with a preferred embodiment of the present invention.

Figure 15:
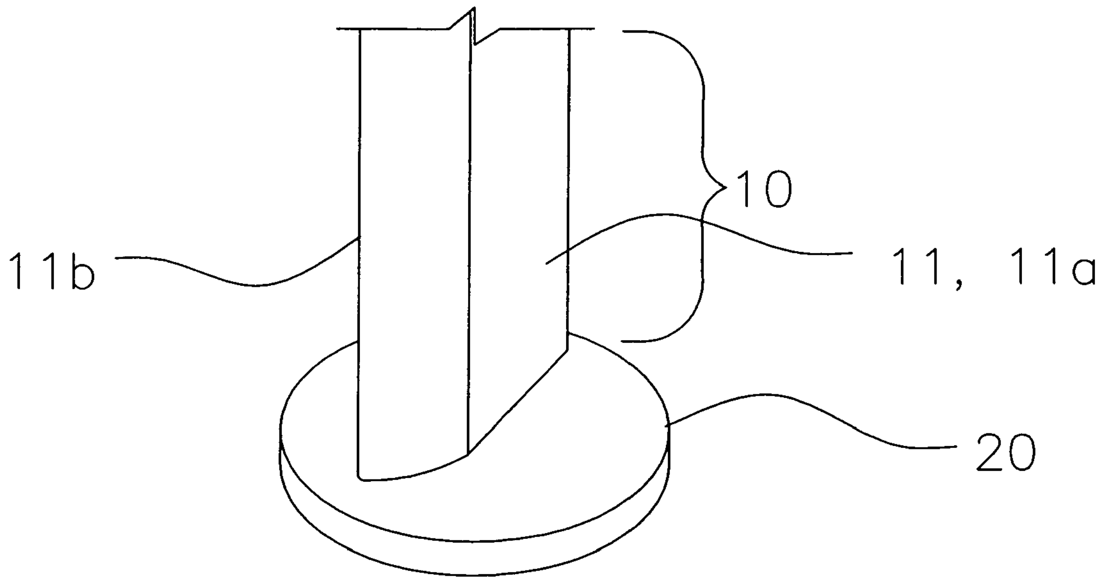
FIG. 15 is a cut-away front perspective view of a surround sound system, having planar speakers in an closed position, in accordance with a preferred embodiment of the present invention.

FIG. 15 illustrates, in a cut-away front perspective view, a surround sound system, having a tower 10 with at least one speaker 11 feature such as a center-channel speaker 11*a* and a planar speaker 11*b*, the tower 10 being mounted on the base plate 20, the planar speaker 11*b* being in the closed position, in accordance with a preferred embodiment of the present invention.

Figure 16:
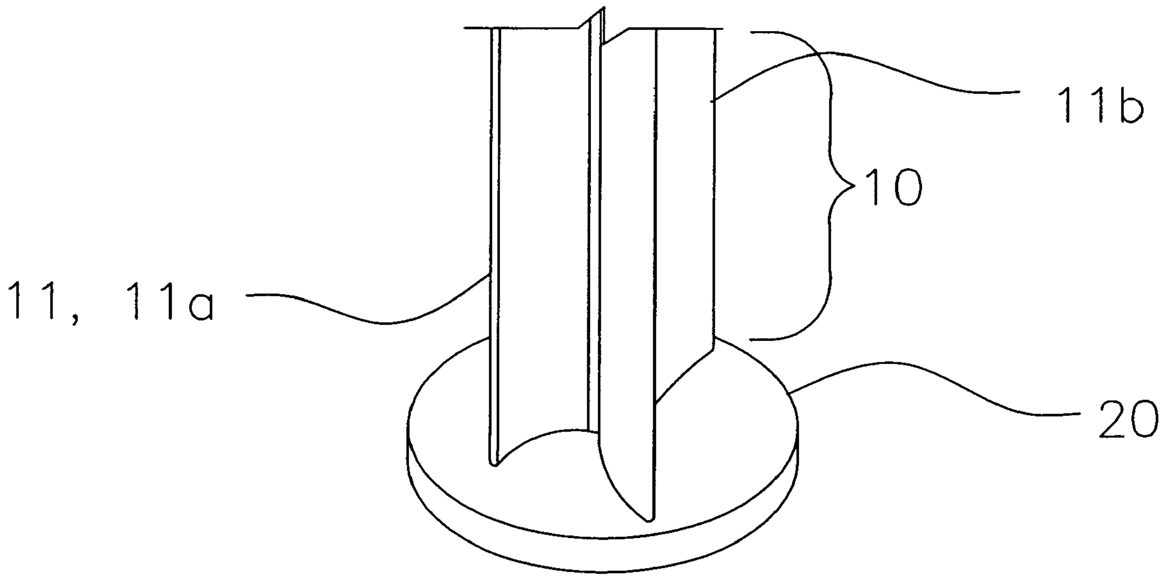
FIG. 16 is a cut-away front perspective view of a surround sound system, having planar speakers in an open position, in accordance with a preferred embodiment of the present invention.

FIG. 16 illustrates, in a cut-away front perspective view, a surround sound system, having a tower 10 with at least one speaker 11 feature such as a center-channel speaker 11*a* and a planar speaker 11*b*, the tower 10 being mounted on the base plate 20, the planar speaker 11*b* being in the open position, in accordance with a preferred embodiment of the present invention.

Figure 17:
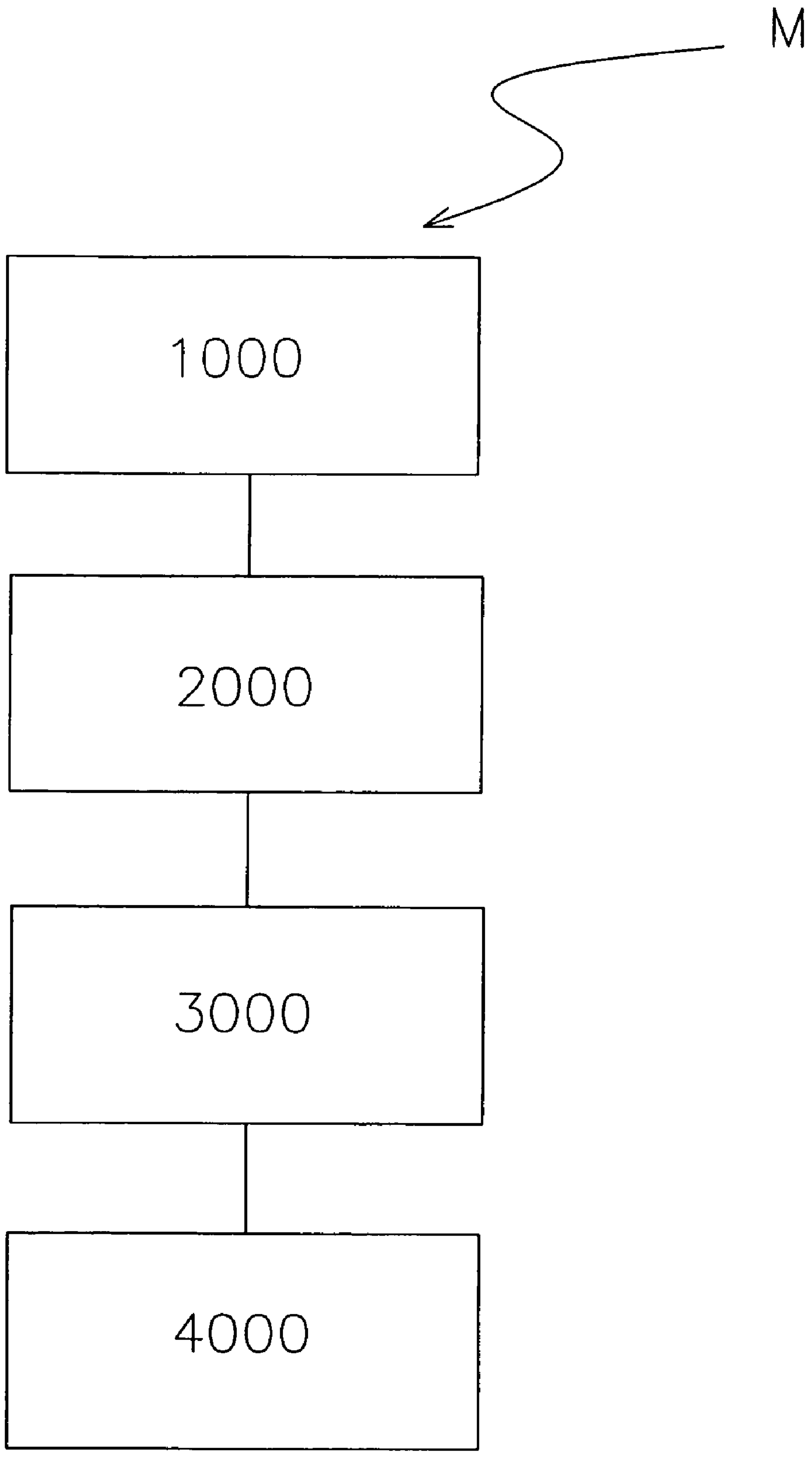
FIG. 17 is a flowchart of the surround sound tower positioning method, in accordance with the present invention.

FIG. 17 illustrates, in a flowchart, the surround sound tower positioning method M, in accordance with the present invention. The surround sound method M, involves the steps of vertically disposing a surround sound tower 10 having at least one planar speaker 11*b* (as indicated by block 1000), horizontally disposing a base plate 20 (as indicated by block 2000), and providing a structure for angular positioning 30 of the surround sound tower 10 on the base plate 20 (as indicated by block 3000), mounting the surround sound tower 10 on, and normal to, the angular positioning structure 30, and positioning the surround sound tower 10 in relation to the base plate 20 using the angular positioning means 30 (as indicated by block 4000). The present method M further involves the steps of providing a binding post 60 (not shown in FIG. 1) disposed at a rear surface of the tower for electronically coupling the tower to the angular positioning structure and providing a light pipe 70 disposed on a rear side of the surround sound tower 10.

In the present method M, the step of providing the angular positioning structure 30 involves the steps of providing structure for indicating an angular rotation or position 40 of the surround sound tower 10 relative to the base plate 20 and providing a structure for facilitating rotation 50 of the angular rotation or position indicating means 40. The step of providing the angular rotation or position indicating structure 40 involves the step of providing a pointer plate 41 having a visible marking 42, e.g., a calibrating dial. The step of providing the facilitating structure 50 involves the step of providing a plurality of ball bearings. The step of horizontally disposing the base plate 20 involves the step of providing a plurality of angular indications 21 thereon formed. The step of vertically disposing the surround sound tower 10 involves the step of further providing at least one feature selected from a group consisting essentially of a center channel speaker 11*a*, a sub-woofer module 12, and a tweeter module 13. The step of providing the sub-woofer module 12 involves the step of providing a sub-woofer 12*a*. The step of providing the tweeter module 13 involves the step of providing a tweeter 13*a*. The step of providing the sub-woofer module 12 further involves providing a detachable permeable sub-woofer housing 12*b* disposed around the sub-woofer 12*a*. The step of providing the tweeter module 13 further involves providing a detachable permeable tweeter housing 13*b* disposed around the tweeter 13*a*. The step of providing the light pipe 70 involves the step of providing at least one function such as indicating a sonic intensity and providing illumination (FIG. 2). The light pipe 70 being disposed on a rear side of the tower 10 produces an aura visual effect when frontally viewed (FIG. 2).

In the method M, the step of providing the surround sound tower 10 also involves the steps of disposing a grill cloth 80 over the center channel speaker 11*a* or the planar speaker 11*b*, disposing a side trim 90 on tower 10, disposing a top cap 100 at a top end of the tower 10, and disposing a bottom cap 110 on the pointer plate 41. The steps of providing the tweeter module 13, disposing the grill cloth 80, and disposing the side trim 90 each comprise forming each respective element in a detachable manner. Each of the foregoing steps involves forming each element from at least one material such as a polymer, a wood, a metal, an anodized metal, an alloy, and a composite material. Preferably, the step of disposing the base plate 20 involves providing a material sufficiently heavy, such as a heavy polymer, a heavy wood (e.g., oak, mahogany, maple), a heavy yet non-toxic metal (e.g., cast or forged iron, cast or forged aluminum), a heavy yet non-toxic anodized metal (e.g., aluminum), a heavy yet non-toxic alloy (e.g., steel, cast steel, forged steel), and a heavy composite material, to support the surround sound tower 10. The step of providing the light pipe 70 also involves forming the light pipe 70 from at least one material such as Plexiglass®, Lexan®, optic fibers, a fluorescent light source, an incandescent light source, a phosphorescent light source. The step of providing the plurality of ball bearings 51 also involves providing a lubricant. The step of providing the visible marking 42 involves providing a colored line and possibly a calibrating dial on the pointer plate 41 being collinear with the user-adjusted angular position indicated on the base plate 20 or providing a tapered slot disposed in the pointer plate 41 being locked by, and unlocked from, a detent provided and disposed on the base plate 20.

In the method M, the step of providing the woofer module 12 further involves providing at least one glide structure 72, in accordance with the present invention. The step of providing the glide structure 72 involves providing a smooth material such as Teflon® or any fluorinated polymer. The step of disposing the tower 10 involves providing a grill cloth 80, an amplifier 12*c*, and fastener 12*d*, and further involves providing a port tube 12*e* and a port tube adapter 12*f*.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, various changes and modifications in form, material, and fabrication detail can be made without departing from the spirit and scope of the inventions as set forth in the appended claims should be readily apparent to those of ordinary skill in the art. No claim herein is to be construed under the provisions of 35 U.S.C. § 112, sixth paragraph, unless the element is expressly recited using the phrase "means for."

INDUSTRIAL APPLICABILITY

The present invention applies industrially to surround sound systems and methods. More particularly, the present invention applies industrially to surround sound tower systems and methods. Even more particularly, the present invention applies industrially to surround sound positioning tower systems and methods with respect to home theater environments.

What is claimed:

1. A surround sound system, comprising:

a surround sound tower being vertically disposed and having at least one planar speaker, wherein the at least one planar speaker can be rotated in an open position or closed position;

a base plate being horizontally disposed; and means for angular positioning of the surround sound tower on the base plate, the surround sound tower being mounted on, and normal to, the angularly positioning means, said angular positioning means having means for indicating an angular position of the surround sound tower relative to the base plate; and means for facilitating rotation of the angular position indicating means.

2. A system, as recited in claim 1, wherein the angular position indicating means comprises a pointer plate having a visible marking, wherein the facilitating means comprises a plurality of ball bearings, and wherein the base plate comprises a plurality of angular indications.

3. A system, as recited in claim 1, wherein the surround sound tower further comprises at least one feature selected from a group consisting essentially of a center channel speaker, a sub-woofer module, and a tweeter module.

4. A system, as recited in claim 3, wherein the sub-woofer module comprises a sub-woofer, and wherein the tweeter module comprises a tweeter.

5. A system, as recited in claim 4, wherein the sub-woofer module further comprises a nestable detachable permeable sub-woofer housing disposed around the sub-woofer, and wherein the tweeter module further comprises a detachable permeable tweeter housing disposed around the tweeter.

6. A system, as recited in claim 5, further comprising a binding post disposed at a rear surface of the tower for electronically coupling the tower to the angular positioning means.

7. A system, as recited in claim 1, further comprising a light pipe disposed on a rear side of the surround sound tower.

8. A system, as recited in claim 7, wherein the light pipe comprises at least one function selected from a group consisting essentially of indicating a sonic intensity and providing illumination.

9. A surround sound system, comprising:

a surround sound tower being vertically disposed and having at least one planar speaker, wherein the at least one planar speaker can be rotated in an open position or closed position;

a base plate being horizontally disposed; and means for angular positioning of the surround sound tower on the base plate, the surround sound tower being mounted on, and normal to, the angular positioning means, said angular positioning means having means for indicating an angular position of the surround sound tower relative to the base plate; and means for facilitating rotation of the angular position indicating means, and wherein the base plate comprises a plurality of angular indications wherein the surround sound tower further comprises at least one feature selected from a group consisting essentially of a center channel speaker, a sub-woofer module, and a tweeter module;

a binding post disposed at a rear surface of the tower for electronically coupling the tower to the angular positioning means; and means for indicating a sonic intensity.

10. A surround sound method, comprising the steps of:

vertically disposing a surround sound tower having at least one planar speaker, wherein the at least one planar speaker can be rotated in an open position or closed position;

horizontally disposing a base plate; and angular positioning of the surround sound tower on the base plate;

mounting the surround sound tower on, and normal to, the angular position and angularly positioning the surround sound tower in relation to the base plate using an angular positioning means, wherein the step of providing the angular positioning means includes the steps of indicating an angular position of the surround sound tower relative to the base plate, and facilitating rotation of the angular position indicating means.

11. A method, as recited in claim 10, wherein the angular position indicating step includes providing a pointer plate having a visible marking, the facilitating rotation of the angular position indicator step includes providing a plurality of ball bearings, and horizontally disposing the base plate step includes providing a plurality of angular indications thereon formed.

12. A method, as recited in claim 10, wherein the step of vertically disposing the surround sound tower comprises the step of further providing at least one feature selected from a group consisting essentially of a center channel speaker, and a sub-woofer module, and a tweeter module.

13. A method, as recited in claim 12, wherein the step of providing the sub-woofer module comprises the step of providing a sub-woofer, and wherein the step of providing the tweeter module comprises the step of providing a tweeter.

14. A method, as recited in claim 13, wherein the step of providing the sub-woofer module further comprises providing a detachable permeable sub-woofer housing disposed around the sub-woofer, and wherein the step of providing the tweeter module further comprises providing a detachable permeable tweeter housing disposed around the tweeter.

15. A method, as recited in claim 14, further comprising the step of providing a binding post disposed at a rear surface of the tower for electronically coupling the tower to the angular positioning means.

16. A method, as recited in claim 10, further comprising the step of providing a light pipe disposed on a rear side of the surround sound tower.

17. A method, as recited in claim 16, wherein the step of providing the light pipe comprises the step of providing at least one function selected from a group consisting essentially of indicating a sonic intensity and providing illumination.

18. A method, as recited in claim 10, further comprising the steps of:

providing a binding post disposed at a rear surface of the tower for electronically coupling the tower to the angular positioning means; and providing a light pipe disposed on a rear side of the surround sound tower, wherein the step of providing the angular positioning means includes the steps of indicating an angular position of the surround sound tower relative to the base plate; and facilitating rotation of the angular position indicating means, wherein the angular position indicating step includes providing a pointer plate having a visible marking, the facilitating rotation of the angular position indicator step includes providing a plurality of ball bearings, horizontally disposing the base plate step includes providing a plurality of angular indications thereon formed, vertically disposing the surround sound tower step includes the step of further providing at least one feature selected from a group consisting essentially of a center channel speaker, and a sub-woofer module, and a tweeter module, wherein the step of providing the sub-woofer module comprises the step of providing a sub-woofer, wherein the step of providing the tweeter module comprises the step of providing a tweeter, wherein the step of providing the sub-woofer module further comprises providing a detachable permeable sub-woofer housing disposed around the sub-woofer, and wherein the step of providing the tweeter module further comprises providing a detachable permeable tweeter housing disposed around the tweeter, wherein the step of providing the light pipe comprises the step of providing at least one function selected from a group consisting essentially of indicating a sonic intensity and providing illumination.

* * * * *